HIGH STABILITY OSCILLATOR GENERATOR

Filed Jan. 18, 1946

LESLIE NORDE
INVENTOR.
BY John J. Logan
ATTORNEY

Patented Jan. 17, 1950

2,495,177

UNITED STATES PATENT OFFICE 2,495,177

HIGH STABILITY OSCILLATOR GENERATOR

Leslie Norde, Hempstead, N. Y., assignor, by mesne assignments, to Jefferson Standard Broadcasting Company, a corporation of North Carolina Application January 18, 1946, Serial No. 641,941

2 Claims. (Cl. 250—36)

This invention relates to vacuum tube oscillators and more particularly to vacuum tube oscillating systems having a high order of frequency stability and of voltage stability.

Oscillating systems using vacuum tubes to amplify electrical energy and an LCR circuit to control the frequency of oscillations have several inherent defects which contribute to the instability of the system. Among these defects are the dependency of the frequency of oscillation upon the gain and phase shift in the amplifier system.

Accordingly, it is a principal object of this invention to provide an adjustable-frequency oscillator which has a very high frequency stability with respect to the variations of the power voltage and with respect to the vacuum tubes that are used.

It is also an object of this invention to provide an adjustable-frequency oscillating system where the oscillating frequency may be varied by a variation of either the inductive or capacitative elements of the LCR circuit cooperating therewith, without appreciably affecting the frequency stability of the system.

It is another object of this invention to provide an adjustable-frequency oscillating system, with a frequency adjustment control accurately calibrated to indicate the frequency of oscillation.

It is a further object of this invention to provide an adjustable-frequency oscillating system which permits a loose coupling of the amplifier to the LCR circuit cooperating therewith, which coupling may be varied in accordance with the particular operating requirements of the system.

This invention comprises an oscillating system employing a high gain amplifier the output of which may be fed into a bridge circuit from which the amplifier receives its input. The bridge circuit contains an LCR circuit a portion of which may comprise one of the bridge legs. The bridge circuit employed includes a thermally sensitive resistance, the resistance of which may be either an increasing or decreasing function of its temperature, the choice of the type of thermally sensitive resistance used being dependent upon the arrangement of the bridge circuit.

Other objects, features and advantages of this invention will become apparent from the following description of the invention taken in connection with the accompanying drawing in which:

Fig. 1 is a schematic diagram of one embodiment of this invention.

Fig. 1*a* is another representation of Fig. 1.

Fig. 1*b* is a vector diagram of the voltages present in part of the system shown in Fig. 1.

Fig. 1*c* is a vector diagram showing the relationship of the voltages shown in Fig. 1*a* under conditions other than those represented by that figure.

Like numerals refer to like parts throughout the several embodiments.

Figure 1:
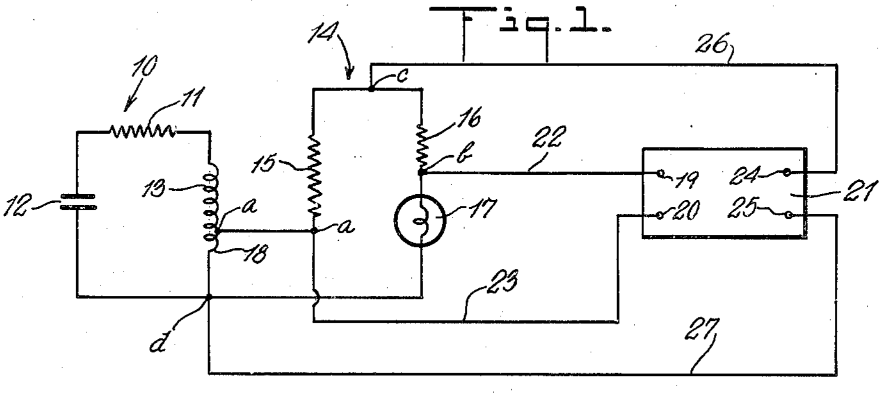
Figure 1B:
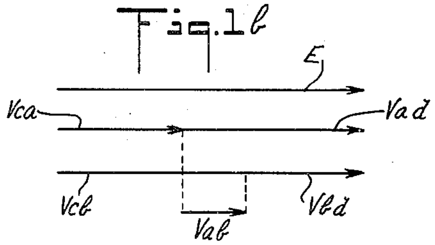

Referring more particularly to Fig. 1, the LCR circuit 10 comprises the resistance 11, condenser 12 and inductance 13 connected in series as shown. Bridge circuit 14 includes resistance 15, resistance 16 and thermally sensitive resistance 17. Resistance 16 is connected between resistances 15 and 17. One end of resistance 17 is connected to the common return point *d* for condenser 12 and inductance 13. One end of resistance 15 is tapped on to inductance 13 at point *a* thereby making the lower portion 18 of inductance 13 also part of the bridge circuit 14.

Input terminals 19, 20, of high gain amplifier 21 are connected to bridge circuit 14 by conductors 22 and 23 respectively. At its other end conductor 22 is connected between resistors 16 and 17 at point *b*, and in the same way conductor 23 is connected between resistance 15 and inductance 18 at point *a*. Output terminals 24, 25, of amplifier 21, are connected to the circuit 14 by conductors 26 and 27 respectively. At its other end conductor 26 is connected between resistances 15 and 16 at point *c*, and in the same way conductor 27 is connected between resistance 17 and inductance 18 at point *d*.

If it is assumed that the phase shift in the amplifier 21 is equal to zero, the operation of the system at the resonant frequency of the LCR circuit 10, may be understood from the following relationship:

$$\frac{Z_{ad}/0^\circ}{R_{db}} > \frac{R_{ca}}{R_{bc}}$$

before the oscillations start. It follows from this relationship that a very small transient disturbance will cause an oscillation of small amplitude in the LCR circuit 10. The presence of this small output in the bridge circuit 14 raises the temperature of the thermally sensitive resistance 17, the resistance of which varies with its temperature which corresponds to increasing the resistance $R_{db}$ indicated in the denominator of the above relationship. This increase of $R_{db}$ causes the above relationship to approach more nearly an equality.

Because the gain of the amplifier 21 is finite, the equality of the above relationship can never be satisfied. However, it may be approached to any desired degree. If G represents the vector gain of a very high gain amplifier 21, $e$ and E the root mean square values of the input and output amplifier voltages respectively and $\theta$ the phase shift in the amplifier, then:

$$G=\frac{E}{e}\underline{/\theta}$$

If the phase shift angle equals zero, all of the voltages in the bridge circuit 14 will be in phase as represented by the vector diagram shown in Fig. 1$b$. The various voltages shown are referred to the points $a$, $b$, $c$ and $d$ shown in Fig. 1. When the phase shift in the amplifier is zero and when the expression $$\frac{2\pi f L}{R}$$

is large as applied to the LCR circuit, the frequency of oscillation is for all practical purposes independent of the gain of the amplifier.

It should be noted that because of the temperature characteristics of the thermally sensitive resistance 17 any change in the gain of amplifier 21 will cause a greater change in its input voltage $e$ than it will cause in its output voltage E.

The phase shift angle in the amplifier may not be equal to zero so let it be considered that it is unequal to zero. For operation that is to satisfy the conditions of oscillation, the phase shift and the attenuation in the bridge circuit 14 must be such that $$GB'=1\underline{/0^\circ}$$

where B' is the vector attenuation in the bridge circuit.

Since B' is the vector attenuation in the bridge circuit and its output voltage $e$ is $\phi$ degrees out of phase with its input voltage E $$B'=B\underline{/\phi}$$

where B is the magnitude of the reciprocal of the amplifier gain G and $$\phi=-\theta$$

It follows therefore that the relationship of B to $e$ and E is as follows:

$$B=\frac{e}{E}$$

Figure 1C:
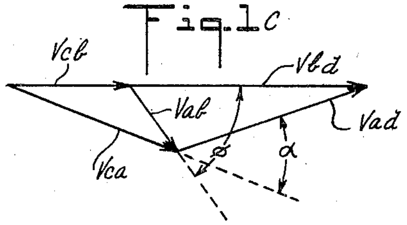

The vector diagram of the voltages present in the bridge circuit 14 under the conditions outlined immediately above are shown in Fig. 1c. As in Figure 1$b$, these voltages are referred to the points $a$, $b$, $c$ and $d$ in Fig. 1. Because $\theta=-\phi$, the frequency of oscillation is not at the resonant frequency of the LCR circuit and its phase angle at the frequency of oscillation is represented by $\alpha$. A small change in the angle $\phi$ will cause the frequency of oscillation to change so that a small change of phase in the LCR circuit results, causing a smaller change in the angle $\alpha$ than the change that has taken place in the angle $\phi$. This may be appreciated from the geometry of Fig. 1c.

Also a small change in the gain of the amplifier causes a small change in the magnitude of voltages $V_{cb}$, $V_{bd}$, $V_{ca}$, and $V_{ad}$, so that the angle $\phi$ remains constant. These changes in magnitude cause a small change in the angle $\alpha$ and a corresponding change in frequency. Nevertheless, if the gain of the amplifier is large and the angle $\phi$ is small, the change in angle $\alpha$ and hence in frequency is negligible.

Figure 2:
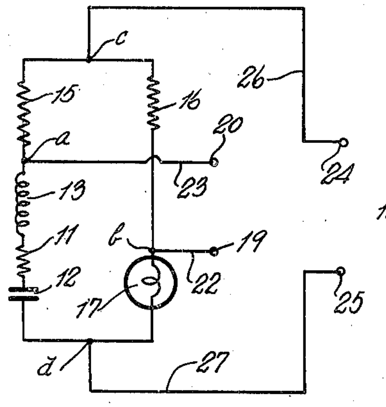
Fig. 2 is a circuit diagram of another embodiment of the invention.
Figure 1A:
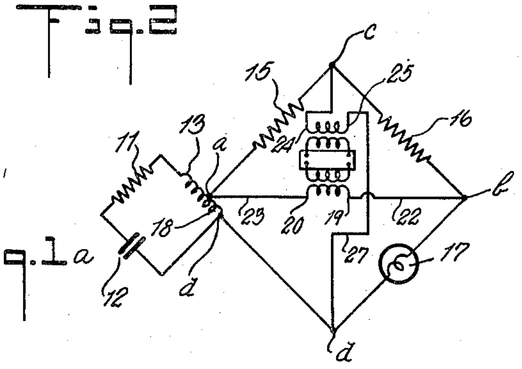

Fig. 2 shows a circuit which is equivalent in its operation to the circuits 10 and 14 in Fig. 1. The only difference in the circuits is the connection of the components of circuit 10 in series between $a$ and $d$ in Fig. 2.

Figure 3:
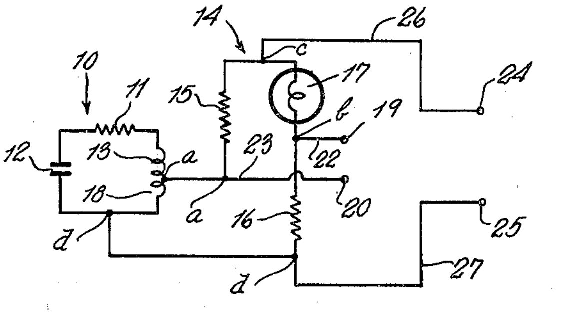
Fig. 3 is a circuit diagram showing a third embodiment of the invention.

Fig. 3 shows another manner of connecting the circuits 10 and 14 shown in Fig. 1. Here resistances 16 and 17 are transposed as compared with Fig. 1. Resistance 17 is thermally sensitive but instead of its resistance being an increasing function of its temperature, it is a decreasing one. The function of the oscillating system remains the same as that shown in Fig. 1 and described in connection therewith.

While there have been here described certain preferred embodiments, it is understood that various changes and modifications may be made therein without departing from the scope of the invention. In the claims the expression LCR means a network comprised of inductance and capacitance components as well as resistance components.

What is claimed is:

1. A high stability oscillator including a high gain amplifier, an LCR circuit comprising a resistance, an inductance and a capacitance forming a series closed resonant loop, a bridge comprising a first resistance arm, a second resistance arm, a third resistance arm, and a fourth arm constituted of a portion of the inductance of said LCR circuit, said third resistance having a predetermined resistance variation with temperature variation, said amplifier having one input terminal connected to the junction between said first resistance and said bridge inductance arm, and the other input terminal being connected to the junction between said second resistor and said third resistor, said amplifier also having one output terminal connected to the junction between said first and second resistors and the other output terminal connected to the junction between said third resistor and said bridge inductance arm.

2. A high stability oscillator system according to claim 1 in which said bridge inductance arm comprises only a small portion of the total inductance in said LCR circuit.

LESLIE NORDE.

REFERENCES CITED

The following references are of record in the file of this patent:

UNITED STATES PATENTS

| Number | Name | Date |
|---|---|---|
| 2,163,403 | Meacham | June 20, 1939 |
| 2,258,128 | Black | Oct. 7, 1941 |
| 2,275,452 | Meacham | Mar. 10, 1942 |

OTHER REFERENCES

Radio Engineering, Terman; publ. by McGraw-Hill Book Company, 2nd edition, p. 377, Figure 205.

The Bridge-Stabilized Oscillator, Meacham, reprint from Proceedings of the Institute of Radio Engineers, vol. 26, No. 10, October 1938.